United States Patent
Lee et al.

(10) Patent No.: US 9,048,322 B2
(45) Date of Patent: Jun. 2, 2015

(54) DISPLAY SUBSTRATE AND METHOD OF MANUFACTURING THE SAME

(71) Applicant: Samsung Display Co., Ltd., Yongin (KR)

(72) Inventors: Yong-Su Lee, Hwaseong-si (KR); Hyang-Shik Kong, Seongnam-si (KR); Yoon-Ho Khang, Yongin-si (KR); Hyun-Jae Na, Seoul (KR); Se-Hwan Yu, Seoul (KR); Myoung-Geun Cha, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 12 days.

(21) Appl. No.: 13/856,851

(22) Filed: Apr. 4, 2013

(65) Prior Publication Data

US 2014/0138671 A1 May 22, 2014

(30) Foreign Application Priority Data

Nov. 19, 2012 (KR) ........................ 10-2012-0130920

(51) Int. Cl.
  *H01L 29/78* (2006.01)
  *H01L 29/66* (2006.01)
  *H01L 29/786* (2006.01)
  *H01L 29/45* (2006.01)

(52) U.S. Cl.
  CPC ...... *H01L 29/7869* (2013.01); *H01L 29/66742* (2013.01); *H01L 29/45* (2013.01); *H01L 29/66969* (2013.01)

(58) Field of Classification Search
  CPC ............ H01L 29/7869; H01L 27/1225; H01L 29/66742; H01L 29/66969; H01L 29/78693; H01L 27/1214; H01L 27/12; H01L 27/3262; H01L 27/3244; G02B 5/201
  USPC .......................... 257/43, E29.273, 99, 344, 98
  See application file for complete search history.

(56) References Cited

U.S. PATENT DOCUMENTS

| 2007/0080346 A1* | 4/2007 | Kim et al. ........................ 257/40 |
| 2007/0109457 A1* | 5/2007 | Song et al. ...................... 349/44 |
| 2010/0006851 A1* | 1/2010 | Park ................................ 257/72 |
| 2011/0227063 A1 | 9/2011 | Yun et al. |

FOREIGN PATENT DOCUMENTS

| JP | 2007-220817 | 8/2007 |
| JP | 2011-91110 | 5/2011 |

* cited by examiner

*Primary Examiner* — Chuong A Luu
*Assistant Examiner* — Rodolfo Fortich
(74) *Attorney, Agent, or Firm* — H.C. Park & Associates, PLC

(57) ABSTRACT

A display substrate includes a base substrate, a data line disposed on the base substrate, a gate line crossing the data line, a first insulation layer disposed on the base substrate, an active pattern disposed on the first insulation layer and comprising a channel comprising an oxide semiconductor, a source electrode connected to the channel, and a drain electrode connected to the channel, a second insulation layer disposed on the active pattern, and contacting to the source electrode and the drain electrode, a gate electrode disposed on the second insulation layer, and overlapping with the channel, a passivation layer disposed on the gate electrode and the second insulation layer, and a pixel electrode electrically connected to the drain electrode through a first contact hole formed through the passivation layer and the second insulation layer.

9 Claims, 5 Drawing Sheets

DISPLAY SUBSTRATE AND METHOD OF MANUFACTURING THE SAME

CROSS REFERENCE TO RELATED APPLICATION

This application claims priority to Korean Patent Application No. 10-2012-0130920, filed on Nov. 19, 2012, which is hereby incorporated by reference for all purposes as if fully set forth herein.

BACKGROUND

1. Field

Exemplary embodiments of the invention relate to a liquid crystal display substrate and a method of manufacturing the liquid crystal display substrate.

2. Discussion of the Background

Generally, a liquid crystal display (LCD) device has various advantageous characteristics, such as a small thickness, a light weight, low power consumption, etc. Thus, LCD devices have been widely used as monitors, personal computers, cellular phones, etc. An LCD device includes an LCD panel that displays an image by controlling the optical transmissivity of a liquid crystal layer, and a backlight assembly to provide light to the LCD panel.

The LCD panel includes an array substrate having a signal line, a thin film transistor, and a pixel electrode, an opposite substrate facing the array substrate and having a common electrode, and a liquid crystal layer disposed between the array substrate and the opposite substrate. Generally, a vertical electric field is formed between the common electrode and the pixel electrode, in order to drive the liquid crystal.

The thin film transistor is a switching element including a semiconductor channel layer, a source electrode, a drain electrode, and a gate electrode. When particles are formed adjacent to the source and the drain electrode, due to a defect of the manufacturing process, off-leakage problems may occur.

BRIEF SUMMARY OF THE INVENTION

One or more exemplary embodiment of the invention provides a display substrate including a switching element having improved electrical characteristics.

One or more exemplary embodiments of the invention also provide method of manufacturing the substrate.

Additional features of the invention will be set forth in the description which follows, and in part will be apparent from the description, or may be learned by practice of the invention.

According to an exemplary embodiment of the invention, a display substrate includes a base substrate, a data line disposed on the base substrate, a gate line crossing the data line, a first insulation layer disposed on the base substrate, an active pattern disposed on the first insulation layer and comprising a channel comprising oxide semiconductor, a source electrode connected to the channel, and a drain electrode connected to the channel, a second insulation layer disposed on the active pattern and contacting the source electrode and the drain electrode, a gate electrode disposed on the second insulation layer and overlapping the channel, a passivation layer disposed on the gate electrode and the second insulation layer, and a pixel electrode electrically connected to the drain electrode through a first contact hole formed through the passivation layer and the second insulation layer.

According to another exemplary embodiment of the invention, a method of manufacturing a display substrate includes forming a data line on a base substrate, forming a first insulation layer on the data line and the base substrate, forming an active pattern having semiconductor on the first insulation layer, forming a second insulation layer on the active pattern, forming a gate electrode on the second insulation layer, the gate electrode overlapping the active pattern, forming a passivation layer on the gate electrode and the second insulation layer, forming a first contact hole through a passivation layer and the second insulation layer to expose the drain electrode, and forming a pixel electrode that is electrically connected to the drain electrode through the first contact hole.

According to various embodiments of the present invention, an active pattern of a switching element includes a channel, a source electrode, and a drain electrode. The source electrode and the drain electrode are covered by a second insulation layer, so that formation of particles adjacent to the active pattern may be prevented. Thus, the off-leakage of the switching element may be reduced.

In addition, a first contact hole exposes the drain electrode, and a second contact hole exposes the source electrode. A pixel electrode and the drain electrode are electrically connected through the first contact hole, and a connecting electrode and the source electrode are electrically connected through the second contact hole, so that there is no necessary to additional patterning of a second insulation layer. Thus, manufacturing process may be simplified.

In addition, while forming a passivation layer, materials that cause a reduction of the active pattern may be added, so that the source electrode and the drain electrode may be formed without additional plasma process. Thus, manufacturing process may be simplified.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

FIGS. 3A to 3I are cross-sectional views to explain a method of manufacturing the display substrate of FIGS. 1 and 2.

DETAILED DESCRIPTION OF THE ILLUSTRATED EMBODIMENTS

Figure 1:
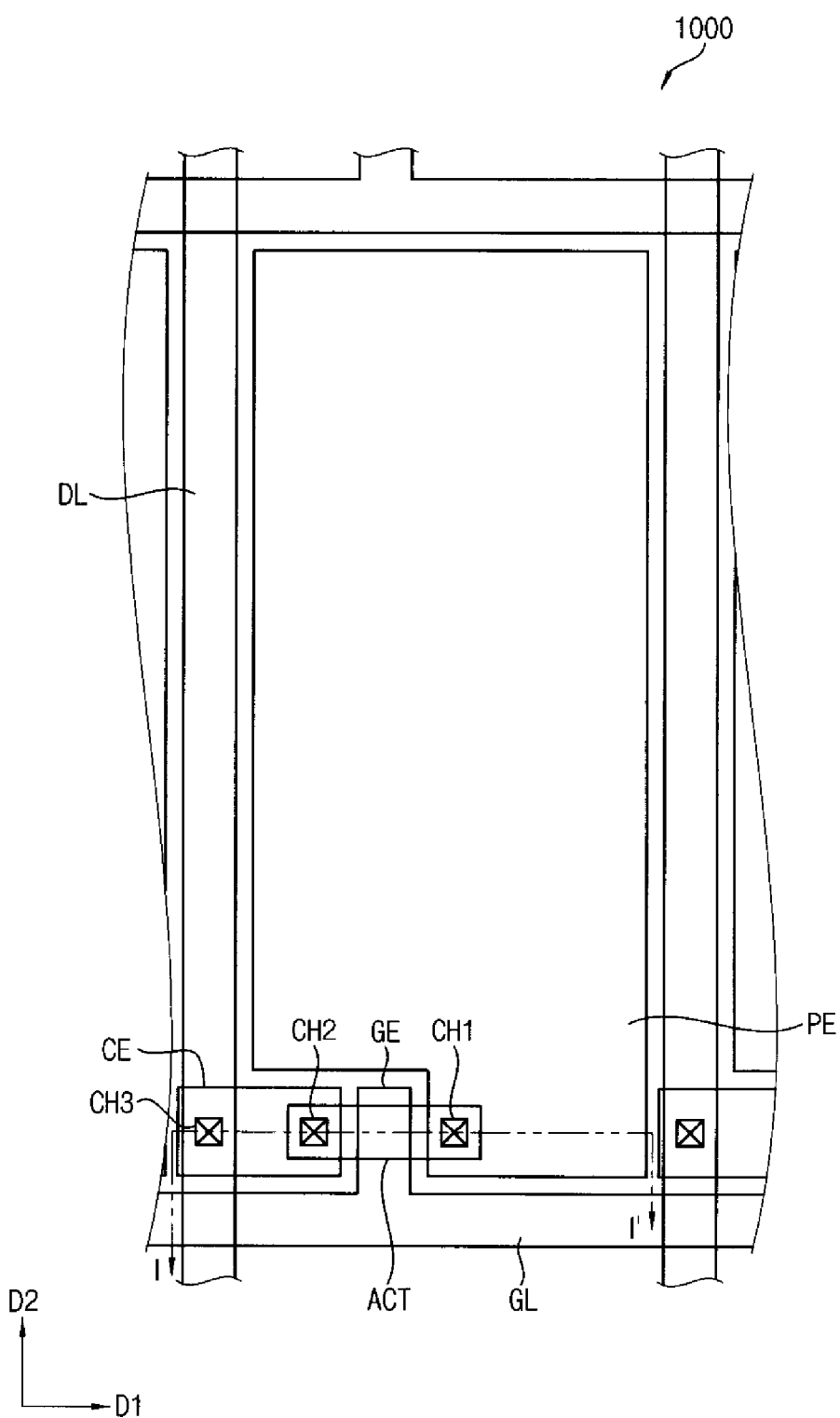
FIG. 1 is a plan view illustrating a display substrate according to an exemplary embodiment of the invention.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "below," "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "under" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

Figure 2:
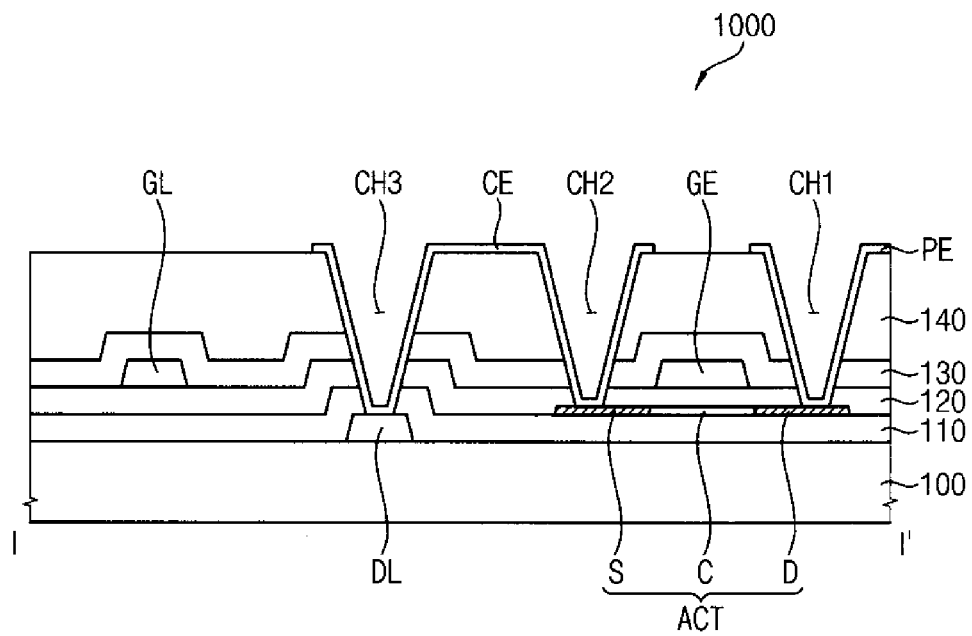
FIG. 2 is a cross-sectional view taken along a line I-I' of FIG. 1.

FIG. 1 is a plan view illustrating a display substrate according to an exemplary embodiment of the invention. FIG. 2 is a cross-sectional view taken along a line I-I' of FIG. 1. Referring to FIGS. 1 and 2, the display substrate 1000 includes a gate line GL, a data line DL, a pixel electrode PE, a connecting electrode CE, and an active pattern ACT that operates as a switching element.

The gate line GL extends along a first direction D1. The data line DL extends along a second direction D2 that is substantially perpendicular to the first direction D1, and crosses the gate line GL.

The gate line GL and the data line DL at least partially define a pixel area. Although only one pixel area is generally described in the figures, the display substrate generally includes a large number of pixel units disposed in respective pixel areas. The pixel areas are typically arrayed, for example, as a regular matrix structure having a plurality of rows and columns. The pixel areas typically have same basic and repeated structures (although some variations, for example, in color of an included color filter portion, or the size or shape of pixel-electrode, may occur). As such, only one pixel area will be described in detail. Although the pixel area has a rectangular shape in the figures, the pixel area may have various modifications in size and/or shape and/or number of field altering slits or other fine features included therein. For example, the pixel areas may be V-shaped or Z-shaped.

The switching element includes a gate electrode GE and the active pattern ACT, which includes a source electrode S, a drain electrode D, and a channel C. The gate electrode GE of the switching element is a protrusion that extends from the gate line GL in the second direction D2. The gate electrode GE overlaps the active pattern ACT.

The pixel electrode PE is formed in the pixel area. The pixel electrode PE is electrically connected to the drain electrode D through a first contact hole CH1. The connecting electrode CE is electrically connected to the data line DL through a third contact hole CH3.

The display substrate 1000 also includes a base substrate 100 a first insulation layer 110, a second insulation layer 120, a passivation layer 130, a planarization layer 140, and a pixel electrode PE. Examples of the base substrate 100 may include a glass substrate, a quartz substrate, a silicon substrate, a plastic substrate, or the like.

The data line DL is disposed on the base substrate 100. The data line DL may have a single layer structure including copper (Cu), silver (Ag), chrome (Cr), molybdenum (Mo), aluminum (Al), titanium (Ti), manganese (Mn), or a mixture thereof. In addition, the data line DL may have a multi-layer structure including a plurality of layers of different materials. For example, the data line DL may include a copper layer and a titanium layer disposed on and/or under the copper layer.

The first insulation layer 110 covers the base substrate 100 and the data line DL. The first insulation layer 110 electrically insulates the data line DL. The first insulation layer 110 may include inorganic material such as silicon oxide ($SiO_x$) and/or silicon nitride ($SiN_x$). For example, the first insulation layer 110 may include silicon oxide ($SiO_x$) and may have a thickness of about 500 Å. In addition, the first insulation layer 110 may include a plurality of layers of different materials.

In the active pattern ACT, the source electrode S and the drain electrode D are connected to opposing sides of the channel C. The source electrode S and the drain electrode D are formed from the same type of material. The channel C is disposed between the source electrode S and the drain electrode D.

The length of the source electrode S, which is the distance between a free end of the source electrode S and an end of the source electrode S connected to the channel C, may be less than 200 μm. For example, the length may be about 100 to 200 μm. In addition, the length of the drain electrode D, which is the distance between a free end of the drain electrode D and an end of the drain electrode D connected to the channel C, may be less than 200 μm. For example, the length may be about 100 to 200 μm.

The second insulation layer 120 is disposed on the active pattern ACT and the first insulation layer 110. Thus, the second insulation layer 120 entirely covers the active pattern ACT, except for a portion where a contact hole is formed, which will be mentioned later. Thus, the second insulation layer 120 is not be removed by additional patterning.

The second insulation layer 120 may include an inorganic material. For example, the second insulation layer 120 may include silicon oxide ($SiO_x$), and may have thickness of 1000 Å. The second insulation layer 120 may have a thickness of about 500 to 1000 Å. In addition, the second insulation layer 120 may include a plurality of layers formed of different materials.

The gate electrode GE is disposed on the second insulation layer 120. The gate electrode GE overlaps with the channel C of the active pattern ACT. The gate electrode GE does not directly overlap with the source electrode S and the drain electrode D. The gate electrode GE is electrically connected to the gate line GL. The gate electrode GE may include the same type of material as the gate line GL.

The channel C, the source electrode S, the drain electrode D, and the gate electrode GE form a switching element. A gate signal is applied to the gate electrode GE through the gate line GL, so that the channel C of the active pattern ACT becomes conductive. Accordingly, data signal from the data line DL is applied to the pixel electrode PE through the connecting electrode CE, the source electrode S, the channel C, and the drain electrode D.

The gate line GL is disposed on the second insulation layer 120. The gate line GL may have a single layer structure including copper (Cu), silver (Ag), chrome (Cr), molybdenum (Mo), aluminum (Al), titanium (Ti), manganese (Mn), or a mixture thereof. In addition, the gate line GL may have a multi-layer structure having a plurality of layers including different materials. For example, the gate line GL may include a copper layer and a titanium layer disposed on and/or under the copper layer.

The passivation layer 130 covers the gate electrode GE and the gate line GL. The passivation layer 130 may include at least one of silicon nitride ($SiN_x$), silicon oxide ($SiO_x$) and aluminum oxide. For example, the passivation layer 130 includes silicon nitride ($SiN_x$), and has a thickness of 1000 Å. In addition, the passivation layer 130 may include fluorine (F).

Thus, the second insulation layer 120 is disposed between the passivation layer 130 and the source electrode S. In addition, the second insulation layer 120 is disposed between the passivation layer 130 and the drain electrode D. Thus, the passivation layer 130 may not directly contact the source electrode S and the drain electrode D.

The planarization layer 140 is disposed on the passivation layer 130. The planarization layer 140 planarizes an upper surface of the substrate 1000, so that problems such as the disconnection of a signal line may be prevented. The first planarization layer 140 may be an insulating layer including an organic material.

A first contact hole CH1 is formed through the planarization layer 140, the passivation layer 130, and the second insulation layer 120, so that the first contact hole CH1 exposes a portion of the drain electrode D. A second contact hole CH2 is formed through the planarization layer 140, the passivation layer 130, and the second insulation layer 120, so that the second contact hole CH2 exposes a portion of the source electrode S. A third contact hole CH3 is formed through the planarization layer 140, the passivation layer 130, the second insulation layer 120, and the first insulation layer 110, so that the third contact hole CH3 exposes a portion of the data line DL.

The pixel electrode PE is disposed on the planarization layer 140, and electrically connected to the drain electrode D through the first contact hole CH1. The pixel electrode may include a transparent conductive material, such as indium tin oxide (ITO), indium zinc oxide (IZO), or the like. In addition, the pixel electrode PE may include titanium (Ti) and/or molybdenum titanium (MoTi).

The connecting electrode CE is disposed on the planarization layer 140, and connects the data line DL to the source electrode S, through the second contact hole CH2 and the third contact hole CH3. Thus, the data line DL is electrically connected to the source electrode S. The connecting electrode CE may include the same type of material as the pixel electrode PE. For example, the connecting electrode CE may include indium tin oxide (ITO), indium zinc oxide (IZO), or the like. In addition, the connecting electrode CE may include titanium (Ti) and/or molybdenum titanium (MoTi).

According to the present exemplary embodiment, the second insulation layer 120 is disposed on (covers) the source electrode S and the drain electrode D, so that off-leakage may be reduced. The off-leakage may occur due to particles disposed between the gate electrode GE and the source electrode S, or between the gate electrode GE and the drain electrode D, which may be formed when the gate electrode GE is formed.

Figure 3A:

FIGS. 3A to 3I are cross-sectional views to explain a method of manufacturing the display substrate of FIGS. 1 and 2. Referring to FIG. 3A, a data metal layer (not shown) is formed on a base substrate 100. Examples of the base substrate 100 may include a glass substrate, a quartz substrate, a silicon substrate, a plastic substrate or the like. The data metal layer may be formed through a sputtering process.

The data metal layer may have a single layer structure including copper (Cu), silver (Ag), chrome (Cr), molybdenum (Mo), aluminum (Al), titanium (Ti), manganese (Mn), or a mixture thereof. In addition, the data metal layer may have a multi-layer structure having a plurality of layers including different materials.

A data line DL is formed by patterning the data metal layer. For example, a photoresist composition is coated on the data metal layer to form a photoresist pattern having a shape corresponding to the data line DL. Thereafter, a portion of the data metal layer that is not covered by the photoresist pattern is etched to form the data line DL.

Figure 3B:
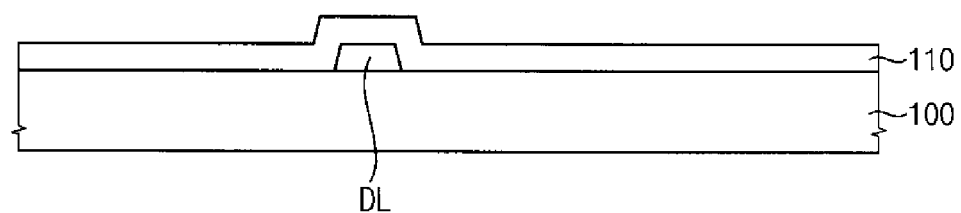

Referring to FIG. 3B, a first insulation layer 110 is formed that covers the base substrate 100 and the data line DL. The first insulation layer 110 may include an inorganic material. For example, the first insulation layer 110 may include silicon oxide ($SiO_x$), and may have a thickness of about 500 Å.

Figure 3C:
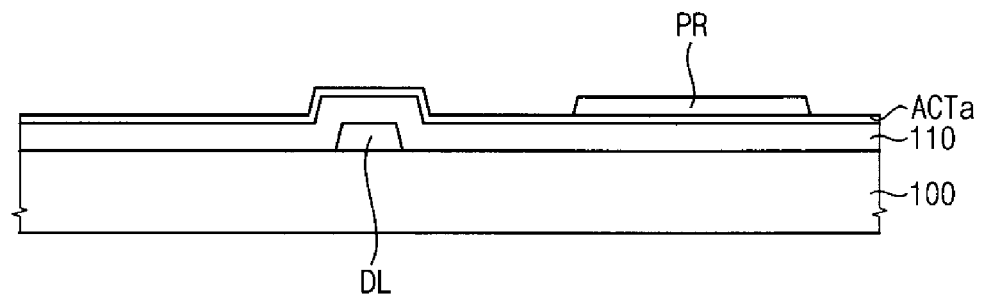

Referring to FIG. 3C, an active layer ACTa is formed on the first insulation layer 110. The active layer ACTa may include a metal oxide semiconductor. For example, the metal oxide semiconductor may include an oxide of zinc, indium, gallium, tin, titanium, phosphorus, or combination thereof. Particularly, the metal oxide semiconductor may include at least one of zinc oxide (ZnO), zinc tin oxide (ZTO), zinc indium oxide (ZIO), indium oxide (InO), titanium oxide (TiO), indium gallium zinc oxide (IGZO), and indium zinc tin oxide (IZTO).

The active layer ACTa may be formed through a chemical vapor deposition (CVD) process, a plasma enhanced chemical vapor deposition (PECVD) process, a solution coating process, or the like. A photoresist pattern PR corresponding to an active pattern (refers to ACT of FIG. 3) is formed on the active layer ACTa.

Figure 3D:
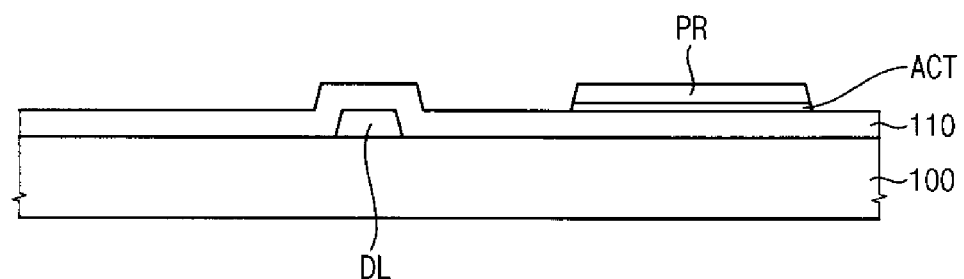

Referring to FIG. 3D, the active pattern ACT is formed by patterning the active layer ACTa. For example, an exposed portion of the active pattern ACT is etched by using the photoresist pattern PR as a mask. Accordingly, an upper surface of the first insulation layer 110 is partially exposed. Thereafter, the photoresist pattern PR is removed.

Figure 3E:
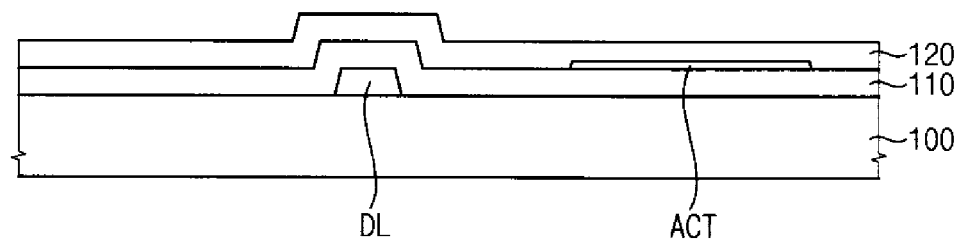

Referring to FIG. 3E, a second insulation layer 120 is formed on the first insulation layer 110 and the active pattern ACT. The second insulation layer 120 may include an inorganic material. For example, the second insulation layer 120 may include silicon oxide ($SiO_x$), and may have a thickness of less than about 1000 Å. For example, the second insulation layer 120 may have a thickness of about 500 to 1000 Å. In addition, the second insulation layer 120 may have a multi-layer structure having a plurality of layers including materials different each other.

Figure 3F:
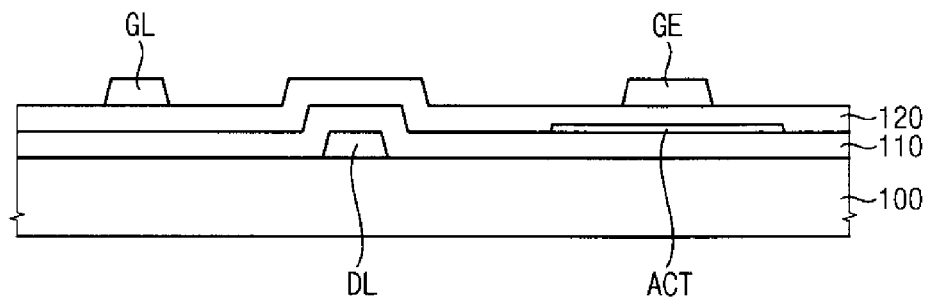

Referring to FIG. 3F, a gate metal layer is formed on the second insulation layer 120. The gate metal layer may have a single layer structure including copper (Cu), silver (Ag), chrome (Cr), molybdenum (Mo), aluminum (Al), titanium (Ti), manganese (Mn) and a mixture thereof. In addition, the gate metal layer may have a multi-layer structure having a plurality of layers including different materials.

A gate line GL and a gate electrode GE are formed by patterning the gate metal layer. For example, a photoresist composition (not shown) is coated on the gate metal layer to form a photoresist pattern having a shape corresponding to the gate line GL and the gate electrode GE. Thereafter, a portion of the gate metal layer that is not covered by the photoresist pattern is etched to form the gate line GL and the gate electrode GE.

According to the present exemplary embodiments, the active pattern ACT is entirely covered with the second insulation layer 120 during the forming of the gate electrode GE, so that the formation of particles adjacent to the active pattern ACT may be prevented. Thus, the off-leakage of a switching element including the active pattern ACT may be reduced.

Figure 3G:
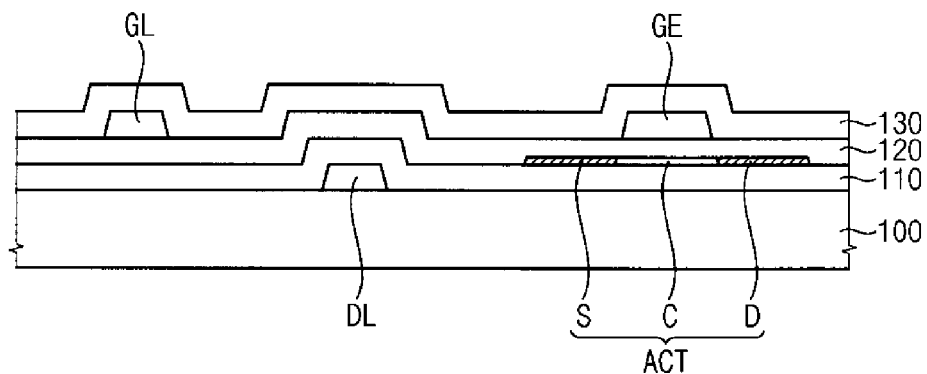

Referring to FIG. 3G, a passivation layer 130 is formed on the gate electrode GE, the gate line GL, and the second insulation layer 120. The passivation layer 130 may include inorganic material. For example, the passivation layer 130 may include silicon nitride ($SiN_x$), and may have a thickness of 1000 Å.

The passivation layer 130 may be formed through a deposition process. For example, the passivation layer 130 may be formed through chemical vapor deposition (CVD), plasma enhanced chemical vapor deposition (PECVD), or the like. For example, an atmosphere of the deposition process may have more than about 10% hydrogen. The deposition may occur at a process temperature of higher than about 300° C. and at a deposition rate of higher than about 10 Å/sec.

During deposition of the passivation layer 130, materials may be added that pass through the second insulation layer 120 and reduce portions of the active pattern ACT. The material may be a fluorine-containing gas. For example, during the deposition of the passivation layer 130, one or more gasses selected from fluorine ($F_2$), nitrogen trifluoride ($NF_3$), tetrafluoromethane ($CF_4$), sulfur hexafluoride ($SF_6$), and octafluorocyclobutane ($C_4F_8$) may be included in the deposition atmosphere. The gas passes through the second insulation layer 120 and reduces portions of the active pattern ACT that are not overlapped with the gate electrode GE, by a plasma effect, so that the source electrode S and the drain electrode D are formed. The reduction process may be referred to as doping. In addition, the deposition atmosphere of the passivation layer 130 may further include noble gases, such as helium (He), argon (Ar), and the like. At that case, plasma pressure may be about 1 mT to about 760 Torr. According to above process, a carrier concentration of the source electrode S and the drain electrode may be more than about $1e^{18}$.

Since the gate electrode G is disposed over a portion of the active pattern ACT that forms the channel C, the channel C is protected from the plasma effect. As such, the channel C is not reduced during the formation of the passivation layer 130.

The size of the elements of the active pattern ACT may be adjusted according to desired electric characteristics. For example, the length of the source electrode S may be less than about 200 μm. In addition, the length of the drain electrode D, may be less than about 200 μm.

Figure 3H:
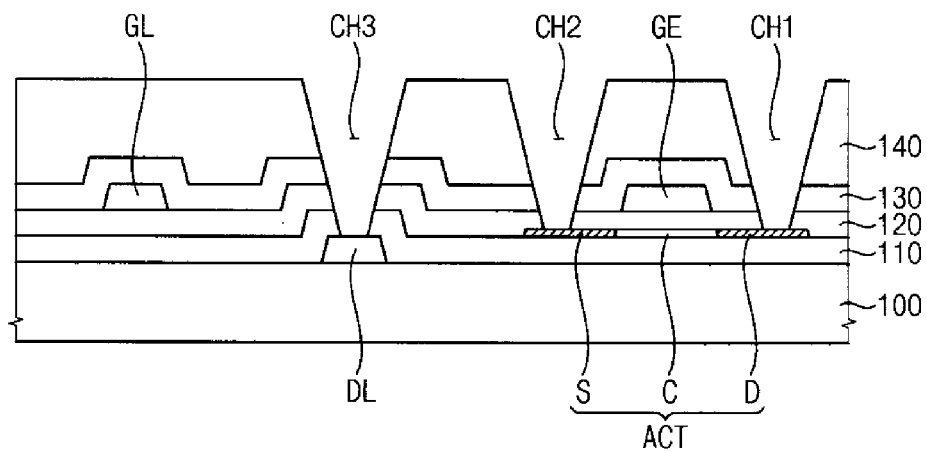
Figure 31:
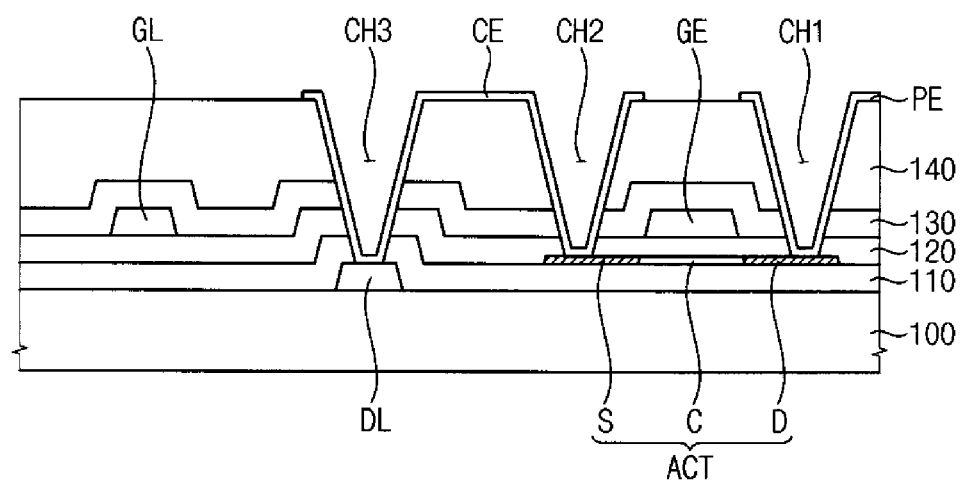

Referring to FIG. 3H, a planarization layer 140 is formed on the passivation layer 130. The planarization layer 140 may include an organic insulation material. A photoresist composition may be coated on the passivation layer 130 through a spin coating, to form the planarization layer 140.

Referring to FIG. 3I, a first contact hole CH1, a second contact hole CH2, and a third contact hole CH3 are formed. The first contact hole CH1 is formed through the planarization layer 140, the passivation layer 130, and the second insulation layer 120, and exposes a portion of the drain electrode D. The second contact hole CH2 is formed through the planarization layer 140, the passivation layer 130, and the second insulation layer 120, and exposes a portion of the source electrode S. The third contact hole CH3 is formed through the planarization layer 140, the passivation layer 130, the second insulation layer 120, and the first insulation layer 110, and exposes a portion of the data line DL.

Referring FIG. 3I, a pixel electrode PE and a connecting electrode CE are disposed on the planarization layer 140. A transparent conductive layer (not shown) is formed on the planarization layer 140. Thereafter, the pixel electrode PE and the connecting electrode CE are formed by patterning the transparent conductive layer. The transparent conductive layer may include a transparent conductive material such as indium tin oxide (ITO), indium zinc oxide (IZO), or the like.

The pixel electrode PE is electrically connected to the drain electrode D through the first contact hole CH1. The connecting electrode CE is electrically connected to the source electrode S through the second contact hole CH2, and is electrically connected to the data line DL through the third contact hole CH3.

According to the exemplary embodiments of the present invention, an active pattern of a switching element includes a channel, a source electrode, and a drain electrode. The source electrode and the drain electrode are covered by a second insulation layer, so that formation of particles adjacent to the active pattern may be prevented. Thus, the off-leakage of the switching element may be reduced.

In addition, a first contact hole exposes the drain electrode, and a second contact hole exposes the source electrode. A pixel electrode and the drain electrode are electrically connected through the first contact hole, and a connecting electrode and the source electrode are electrically connected through the second contact hole, so that additional patterning of a second insulation layer is unnecessary. Thus, the manufacturing process may be simplified.

In addition, when forming a passivation layer, materials that reduce the active pattern may be added to a deposition atmosphere, so that the source electrode and the drain electrode may be formed without an additional plasma process. Thus, the manufacturing process may be simplified.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A method of manufacturing a display substrate comprising:
    forming a data line on a substrate;
    forming a first insulation layer on the data line and the substrate;
    forming an active pattern having semiconductor characteristics, on the first insulation layer;
    forming a second insulation layer on the active pattern;
    forming a gate electrode on the second insulation layer and overlapping the active pattern;
    forming a passivation layer on the gate electrode and the second insulation layer;
    forming a planarization layer on the passivation layer;
    forming a first contact hole through the planarization layer, the passivation layer, and the second insulation layer, thereby exposing the drain electrode; and
    forming a pixel electrode on the planarization layer, the pixel electrode being electrically connected to the drain electrode through the first contact hole.

2. The method of claim 1, wherein during the formation of the passivation layer, a source electrode and a drain electrode are formed by reducing portions of the active pattern that do not overlap the gate electrode.

3. The method of claim 2, wherein the forming of the source electrode and the drain electrode comprises using a fluorine-containing gas to reduce the portions of the active pattern, while forming the passivation layer by depositing silicon nitride $SiN_x$.

4. The method of claim 3, wherein the fluorine-containing gas comprises one or more gasses selected from fluorine ($F_2$), nitrogen trifluoride ($NF_3$), tetrafluoromethane ($CF_4$), sulfur hexafluoride ($SF_6$), and octafluorocyclobutane ($C_4F_8$).

5. The method of claim 1, further comprising forming a second contact hole through the planarization layer, the passivation layer, and the second insulation layer, to expose a source electrode of the active pattern.

6. The method of claim 1, wherein providing the passivation layer comprises forming the passivation layer by a deposition process and at processing temperature of more than 300° C. and in a deposition atmosphere having a hydrogen content of more than about 10%.

7. The method of claim 6, wherein the deposition atmosphere comprises one or more gasses selected from fluorine ($F_2$), nitrogen trifluoride ($NF_3$), tetrafluoromethane ($CF_4$), sulfur hexafluoride ($SF_6$), and octafluorocyclobutane ($C_4F_8$).

8. A method of manufacturing a display substrate comprising:
    forming a data line on a substrate;
    forming a first insulation layer on the data line and the substrate;
    forming an active pattern having semiconductor characteristics, on the first insulation layer;
    forming a second insulation layer on the active pattern;
    forming a gate electrode on the second insulation layer and overlapping the active pattern;
    forming a passivation layer on the gate electrode and the second insulation layer;
    forming a first contact hole through the passivation layer and the second insulation layer, thereby exposing the drain electrode;
    forming a pixel electrode that is electrically connected to the drain electrode through the first contact hole;
    forming a second contact hole through the passivation layer and the second insulation layer, to expose a source electrode of the active pattern;
    forming a third contact hole through the passivation layer, the second insulation layer, and the first insulation layer, to expose the data line; and
    forming a connecting electrode electrically connecting the data line to the source electrode, through the second contact hole and the third contact hole.

9. The method of claim 8, further comprising forming a planarization layer on the passivation layer.

* * * * *